United States Patent [19]

Vaughn

[11] Patent Number: 4,688,018
[45] Date of Patent: Aug. 18, 1987

[54] MULTIFUNCTION ANALOG-TO-DIGITAL SUCCESSIVE APPROXIMATION REGISTER

[75] Inventor: Herchel A. Vaughn, Austin, Tex.

[73] Assignee: Motorola, Inc., Schaumburg, Ill.

[21] Appl. No.: 776,312

[22] Filed: Sep. 16, 1985

[51] Int. Cl.[4] ............................................. H03M 1/38
[52] U.S. Cl. ........................ 340/347 AD; 340/347 M;
340/347 SH; 377/54; 377/64; 377/79
[58] Field of Search ............................ 377/54, 64, 79;
340/347 AD, 347 SH, 347 M

[56] References Cited

U.S. PATENT DOCUMENTS

| 3,541,446 | 11/1970 | Prozeller | 340/347 CC X |
| 3,781,871 | 12/1973 | Mattern | 340/347 AD |
| 3,832,707 | 8/1974 | Buchanan et al. | 340/347 DA |
| 4,083,043 | 4/1978 | Breuer | 340/347 AD |
| 4,592,367 | 6/1986 | Imran | 377/54 X |
| 4,598,214 | 7/1986 | Sexton | 377/79 X |

OTHER PUBLICATIONS

Hnatek, a User's Handbook of D/A and A/D Converters, J. Wiley & Sons, Inc., 1976, pp. 268–274.
The Engineering Staff of Analog Devices, Inc., Analog–Digital Conversion Handbook, 6/1972, pp. II-46 to II-49.

Primary Examiner—T. J. Sloyan
Attorney, Agent, or Firm—John A. Fisher; Jeffrey Van Myers; Jonathan P. Meyer

[57] ABSTRACT

A successive approximation analog-to-digital converter, of the type which successively compares an analog level represented by binary weighted bits with an analog signal and in response thereto generates a signal indicating whether each successive binary bit should be set or reset, includes a shaft register for counting cycles during the sampling phase and generating signals for controlling the setting and resetting of each bit. Each binary bit cell includes a latch capable of assuming first and second stable states. A first string of field-effect-transistors coupled to the latch and controlled by the shift register receives a first signal indicating that the latch should be reset. A second string of field-effect-transistors coupled to the latch and controlled by the shift register receives a signal indicating that the latch should remain in a set condition.

9 Claims, 1 Drawing Figure

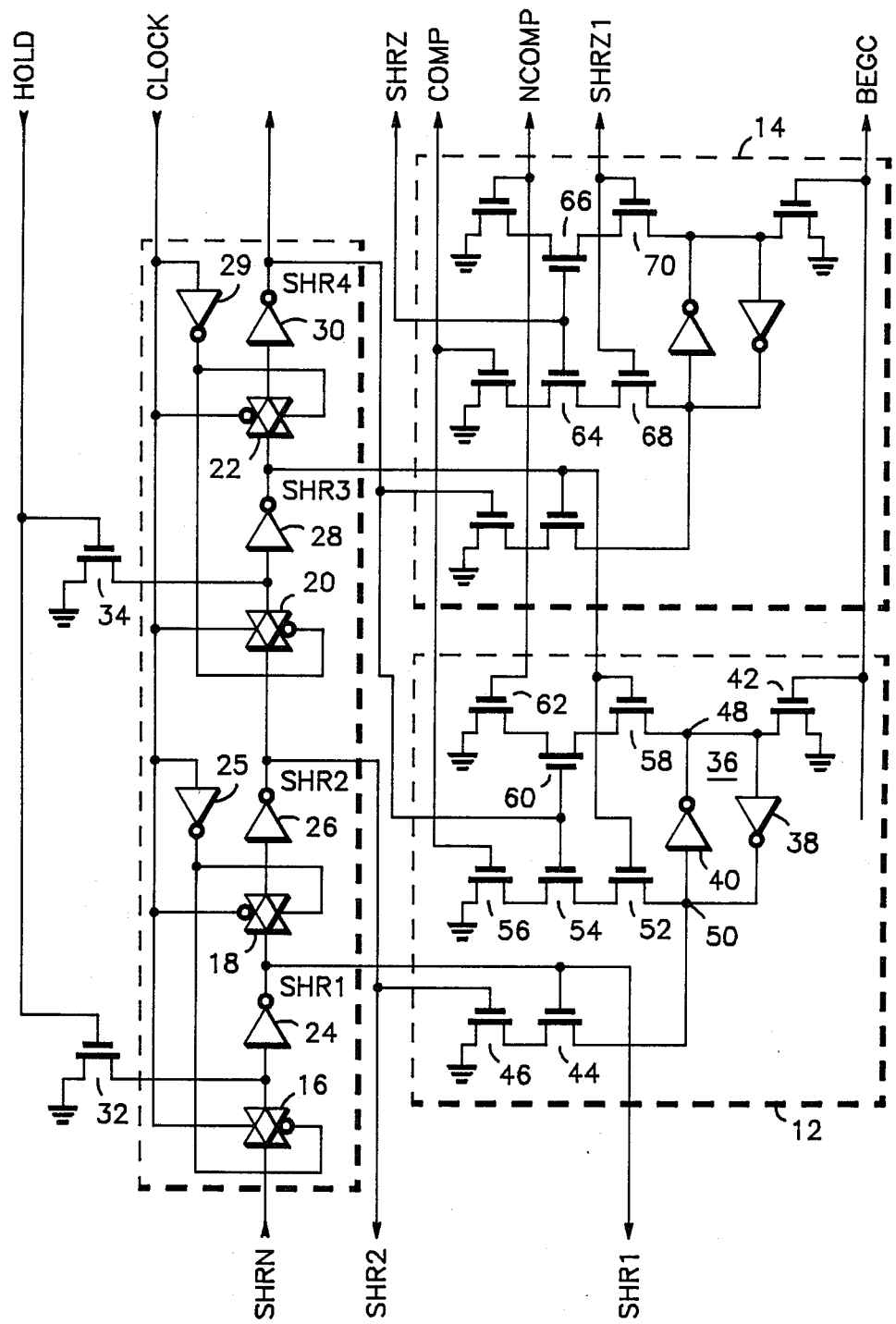

MULTIFUNCTION ANALOG-TO-DIGITAL SUCCESSIVE APPROXIMATION REGISTER

BACKGROUND OF THE INVENTION

This invention relates generally to analog-to-digital converters and, more particularly, to a successive approximation register (SAR) for an analog-to-digital converter which first counts clock cycles to measure the sampling period and then successively sets the comparison bits.

Successive approximation registers for use in analog-to-digital conversion are well known. Using the successive approximation technique, a plurality of binary weighted bits are successively set and then the corresponding analog level is compared with the analog signal to determine if the binary bit should remain set or be reset. That is, first the most significant bit of a desired binary representation of the analog signal is set. The resulting digital representation (in this case the most significant bit set and the remaining bits reset) is then converted to an analog signal and compared with the original analog input. If the binary representation corresponds to an analog signal which is greater than the original input analog signal, the bit is reset. If the binary representation corresponds to a value which is less, the most significant bit remains set. In either case, the next most significant bit is set and the binary representation (i.e. 0100 . . . 0 or 1100 . . . 0) is converted to an analog signal and compared. In this case, if the binary representation is greater than the original analog input, the next most significant bit is reset. Otherwise, it remains set. This process is repeated until a complete binary representation of the original analog input signal is achieved.

The typical successive approximation register for use in analog-to-digital conversion includes special clock counters to control the sampling period and the successive setting and resetting of the comparison bits. Unfortunately, these counters not only complicate the SAR register but also require additional silicon area in the case of an integrated circuit.

SUMMARY OF THE INVENTION

It is an object of the present invention to provide an improved analog-to-digital successive approximation register.

It is a further object of the present invention to provide a successive approximation register for use in analog to digital conversion which does not require the use of special clock cycle counters.

It is a still further object of the present invention to provide a successive approximation register which itself counts clock cycles to measure the sampling period and then successively sets the comparison bits.

Yet another object of the present invention is to provide an integrated successive approximation register which occupies less silicon area on the integrated circuit chip.

According to a broad aspect of the invention there is provided a successive approximation analog-to-digital converter of the type which successively compares an analog level represented by binary weighted bits with an analog signal and in response thereto generates at least one comparison signal indicating whether each successive binary weighted bit should be set or reset, the result being a digital representation of said analog signal, said converter comprising: shift register means having an input and a plurality of outputs; and a plurality of bit cells each comprising, a latch capable of assuming first and second stable states; first means coupled to the latch and to at least a first predetermined one of the plurality of outputs for placing the latch in one of the first and second states at a first predetermined time; and second means coupled to the latch and to at least a different predetermined one of the plurality of outputs for receiving the comparison signal and, if indicated by the state thereof, altering the state of the latch at a second predetermined time.

BRIEF DESCRIPTION OF THE DRAWINGS

The above and other objects, features and advantages of the present invention will be more clearly understood from the following detailed description taken in conjunction with the accompanying drawing which is a schematic diagram of the inventive successive approximation register.

DESCRIPTION OF THE PREFERRED EMBODIMENT

Referring to the drawing, the inventive successive approximation register includes a shift register 10 and a plurality of bit cells only two of which 12 and 14 are shown for clarity.

Shift register 10 includes a plurality of series coupled transmission gates 16, 18, 20 and 22. A clock signal (CLOCK) is applied to transmission gates 16, 18, 20, and 22 directly and via inverters 25 and 29. An inverter 24 is coupled between the output of the transmission gate 16 and the input of transmission gate 18. Similarly, an inverter 26 is coupled between transmission gates 18 and 20, and inverter 28 is coupled between transmission gates 20 and 22. The output of transmission gate 22 is coupled to the input of an inverter 30 at the output of which a control signal SHR4 is produced, the purpose of which will become apparent hereinafter.

The input to the shift register (SHRN) is applied to the input of transmission gate 16. A first N-channel field-effect-transistor 32 has its drain electrode coupled to the junction of the output of transmission gate 16 and the input of inverter 24. A second N-channel field effect transistor 34 has its drain electrode coupled to the junction of the output of transmission gate 20 and the input of inverter 28. The source electrodes of field effect transistors 32 and 34 are coupled to ground while the gate electrodes are coupled to receive a control signal (HOLD) the purpose of which will be described hereinafter.

Several control signals are generated by shift register 10. For example, control signal SHR1 is produced at the output of inverter 24 while SHR2 is produced at the output of inverter 26. Similarly, control signal SHR3 is produced at the output of inverter 28, and SHR4 is produced at the output of inverter 30.

As stated previously, the inventive successive approximation register includes bit cells 12 and 14. Since these cells are identical in structure and perform in a similar manner, only bit cell 12 will be described.

Bit cell 12 includes a bit latch 36 comprised of inverters 38 and 40. As can be seen, the output of inverter 40 is coupled to the input of inverter 38, and the output of inverter 38 is coupled to the input of inverter 40. Both the output of inverter 40 and the input of inverter 38 are coupled to the drain electrode of an N-channel field-effect-transistor 42 which has a source coupled to ground and a gate electrode coupled to receive a Begin Comparison control signal (BEGC). The output of inverter 38 and the input of inverter 40 is coupled to the drain of field-effect-transistor 44 which has a source electrode coupled to the drain of field effect transistor 46. The source electrode of field effect transistor 46 is coupled to ground. The gate electrodes of field-effect-transistors 44 and 46 are coupled respectively to control signals SHR1 and SHR2 generated by shift register 10 as previously described. Thus, it should now be apparent that when field-effect-transistor 42 is turned on, the input of inverter 38 goes low producing a logical high at the input of inverter 40 which in turn enhances the logical low at the input of inverter 38. The output of latch 36 as represented by node 48 may now be said to be low. If field-effect-transistor 42 is off and field-effect-transistors 44 and 46 are turned on, a logical low is placed at the input of inverter 40 causing node 48 to rise to a logical high voltage. This logical high voltage applied to the input of inverter 38 enhances the low voltage at the input of inverter 40. The output of the latch may now be said to be a logical high. Three series coupled N-channel field-effect-transistors 52, 54 and 56 are coupled between ground and node 50. Field-effect-transistor 52 has a drain coupled to node 50 and a source coupled to the drain of N-channel field-effect-transistor 54, the source of which is coupled to the drain field-effect-transistor 56. The source electrode of N-channel field effect transistor 56 is coupled to ground. The gate electrodes of transistors 52 and 54 are coupled respectively to control signals SHR3 and SHR4 generated by shift register 10. The gate electrode of transistor 56 is coupled to a control signal (COMP) for purposes which will be discussed hereinbelow.

In a similar manner, node 48 is coupled to ground via three N-channel field effect transistors 58, 60, and 62. The drain of transistor 58 is coupled to node 48, and a source of transistor 58 is coupled to the drain of transistor 60. The source of transistor 60 is coupled to the drain of transistor 62, the source of which is coupled to ground. The gate electrodes of transistors 58 and 60 are coupled respectively to control signals SHR3 and SHR4 which were generated by shift register 10. The gate electrode of transistor 62 is coupled to a control signal (NCOMP) which indicates that the binary representation produced thus far is greater than the analog signal being converted.

The inventive successive approximation register operates as follows. Prior to comparison, the circuit is initialized by BEGC and HOLD going high. As a result, transistor 42 turns on, placing a ground voltage at node 48 thus resetting latch 36. Also, field effect transistors 32 and 34 turn on, placing a low voltage at the output of transmission gates 16 and 20 respectively. In this initial state, SHR1 equals one, SHR2 equals 0, SHR3 equals 1 and SHR4 equals 0. (The numerals "1" and "0" designate logical high and logical low states respectively.)

After the successive approximation register bits have been reset and shift register 10 initialized as previously described, a clock signal (CLOCK), of the type wherein each cycle has a high portion and a low portion, is applied to transmission gates 16, 18, 20 and 22 both directly and via inverters 25 and 29 such that when the clock signal is high, transmission gates 16 and 20 are turned on and transmission gates 18 and 22 are off. In contrast, when the clock signal is low, transmission gates 16 and 20 are off and transmission gates 18 and 22 are on.

As is well known, it is first necessary to sample the analog signal which is to be converted. In order to allow sufficient time to accomplish this sampling, SHRN at the input of transmission gate 16 goes high, and shift register 10 functions under the control of the clock signal. As a result, during the first half of the first clock cycle SHR1 shifts to a low state. During the second half or low portion of the first clock cycle SHR2 shifts to a high state. During the high portion of the second clock cycle SHR3 shifts to a low state, and finally during the second half or low portion of the second clock cycle SHR4 shifts to a high state. Thus, during the second half of the second clock cycle, the shift register has achieved the state wherein SHR1 equals 0, SHR2 equals 1, SHR3 equals 0 and SHR4 equals 1. As a result, transistors 44, 52 and 58 in bit cell 12 remain off thus isolating bit latch 36 so that it is not affected by this shifting operation. Neither of the nodes 48 or 50 must share charge with any other nodes during the sampling period clock cycles, so there is no risk of flipping latch 36 unintentionally. The shift register control signals remain in this state as long as the input SHRN remains high. The shift register serves as a counter since one clock cycle is required to progress through each stage of the register. The appropriate stage will be monitored by the control logic for the required number of clock cycles for sampling.

After a predetermined number of clock cycles (e.g. six) during which the analog input signal (not shown) has been sampled, the shift register input SHRN is changed to a low state. Thus, during the first half or upper portion of the seventh clock cycle SHR1 shifts to a 1. With SHR1 and SHR2 in the high state, both transistors 44 and 46 are turned on placing a low voltage at node 50. This causes bit latch 36 to be set (i.e. the high voltage appears at node 48). The analog comparison now begins. During the second half or low portion of the seventh clock cycle, SHR2 shifts to a low and SAR bit 36 is latched (not affected). During the first or high portion of the eighth clock cycle, SHR3 shifts to a one. With both SHR3 and SHR4 high, transistors 52, 54, 58, and 60 are turned on, and the latch in bit cell 14 is set in the same manner that latch 36 was set by SHR1 and SHR2.

By this time, comparison of the digital representation with the analog input signal has been completed and either control signal COMP or control signal NCOMP will go high depending on whether the binary representation is lower or higher than the analog signal. If lower, COMP will go high turning transistor 56 on. A low voltage will then be applied via transistors 52, 54 and 56 to node 50 enhancing the set state of latch 36. This enhancement is necessary because charge shared by node 48 as SHR3 shifts to a high could be enough to reset latch 36. If, on the other hand, the binary representation turns out to be greater than the analog signal, NCOMP will go high causing transistor 62 to turn on. With transistors 58, 60 and 62 on, a low voltage is applied to node 48 causing bit latch 36 to be reset.

During the second half of the eighth clock cycle, the shift register assumes the situation wherein SHR1 equals 1, SHR2 equals 0, SHR3 equals 1 and SHR4 equals 0. Under these conditions, transistors 46, 54 and 60 remain off.

SHRZ and SHRZ1 represent control signals from the shift register 10 down stream of that portion which is shown in the drawing. Control signal SHRZ is applied to transistors 64 and 66 while signal SHRZ1 is applied to transistors 68 and 70. The purpose of these signals is to control the setting and resetting of bit cell 14 in the same manner as SHR3 and SHR4 controlled bit cell 12.

Thus, there has been produced a successive approximation register which does not require the use of clock cycle counters and as a result occupies less silicon area when integrated. Furthermore, during the sampling phase, (i.e. SHRN equals 1) the SAR latches are not affected.

The above description is given by way of example only. Changes in form and details may be made by one skilled in the art without departing from the scope of the invention as defined by the appended claims.

I claim:

1. In a successive approximation-type analog-to-digital converter, a successive approximation register comprising:
    a shift register having an input and a plurality of outputs and being adapted to respond to a clock signal; and
    a plurality of successive approximation bit cells each comprising:
        a latch capable of assuming first and second stable states;
        first means coupled to at least one output of said shift register for responding to said output by placing said latch in one of said first and second stable states at a first time predetermined with respect to said clock signal, said first means being incapable of altering the state of said latch in response to said at least one output while said input of said shift register is in a first predetermined state regardless of said clock signal;
        second means coupled to at least one output of said shift register different from said at least one output to which said first means is coupled and coupled to at least one comparison signal for responding to said at least one output and said at least one comparison signal by altering the state of said latch at a second time predetermined with respect to said clock signal; and wherein said second means further comprises:
            third means for altering the state of said latch; and
            fourth means for enhancing the state of said latch.

2. A successive approximation register according to claim 1 wherein said at least one comparison signal comprises:
    a first signal for indicating that the state of said latch should be altered; and
    a second signal indicating that the state of said latch should remain unchanged.

3. A successive approximation register according to claim 2 wherein said first means comprises:
    a first field effect transistor having a source coupled to receive a first supply voltage, a gate coupled to a first of said plurality of outputs and having a drain; and
    a second field effect transistor having a source coupled to the drain of said first field effect transistor, a gate coupled to a second one of said plurality of outputs, and a drain coupled to said latch.

4. A successive approximation register according to claim 3 wherein said third means comprises:
    a third field-effect-transistor having a source coupled to receive said first source of supply voltage, a gate coupled to receive said first signal, and having a drain;
    a fourth field-effect-transistor having a source coupled to the drain of said third field-effect-transistor, a gate coupled to a third one of said plurality of outputs, and having a drain; and
    a fifth field-effect-transistor having a source coupled to the drain of said fourth field-effect-transistor, a gate coupled to a fourth one of said plurality of outputs, and a drain coupled to said latch.

5. A successive approximation register according to claim 4 wherein said fourth means comprises:
    a sixth field-effect-transistor having a source coupled to receive said first supply voltage, a gate coupled to said second signal, and having a drain;
    a seventh field-effect-transistor having a source coupled to the drain of said sixth field-effect-transistor, a gate coupled to said third one of said plurality of outputs, and having a drain; and
    an eighth field-effect-transistor having a source coupled to the drain of said seventh field-effect-transistor, a gate coupled to said fourth one of said plurality of outputs and a drain coupled to said latch.

6. A successive approximation register according to claim 5 wherein said latch comprises:
    a first inverter having an input and output; and
    a second inverter having an input coupled to the output of said first inverter and having an output coupled to the input of said first inverter.

7. A successive approximation register according to claim 5 further comprising means for initializing said latch.

8. A successive approximation register according to claim 7 further comprising a means for initializing said shift register.

9. A successive approximation register according to claim 8 wherein said shift register means includes a first transmission gate to which a first signal is applied during sampling of said analog signal, and to which a second signal is applied during comparison.

* * * * *